United States Patent [19]
Schneider et al.

[11] Patent Number: 5,757,645
[45] Date of Patent: May 26, 1998

[54] DIAGNOSTIC METHOD FOR MOTOR VEHICLES FOR CHECKING ELECTRONICALLY CONTROLLED SYSTEMS

[75] Inventors: Josef Schneider, Altomuenster; Hans Hohenner, Munich, both of Germany

[73] Assignee: Bayerische Motoren Werke AG, Munich, Germany

[21] Appl. No.: 562,350

[22] Filed: Nov. 22, 1995

Related U.S. Application Data

[63] Continuation of Ser. No. 262,757, Jun. 20, 1994, abandoned.

[30] Foreign Application Priority Data

Jun. 18, 1993 [DE] Germany .................. 43 20 173.3

[51] Int. Cl.$^6$ ...................... G01M 17/00; F02B 77/08
[52] U.S. Cl. ................. 364/424.034; 364/424.036; 364/424.037; 364/424.04; 364/551.01
[58] Field of Search .................. 364/424.03, 424.06, 364/424.05, 551.01, 571.01, 571.02, 571.04, 579, 580, 424.034, 424.035, 424.036, 424.038, 424.039; 371/3, 20.4

[56] References Cited

U.S. PATENT DOCUMENTS

| | | | |
|---|---|---|---|
| 4,271,402 | 6/1981 | Kastura et al. | 340/459 |
| 4,277,772 | 7/1981 | Kastura et al. | 340/459 |
| 4,404,639 | 9/1983 | McGuire et al. | 364/551.01 |
| 4,757,463 | 7/1988 | Ballou et al. | 364/424.03 |
| 4,796,206 | 1/1989 | Boscove et al. | 364/551.01 |
| 4,831,560 | 5/1989 | Zaleski | 364/431.01 |
| 4,837,552 | 6/1989 | Vandemotter et al. | 340/461 |
| 4,953,277 | 9/1990 | Crispin et al. | 29/407.05 |
| 4,977,524 | 12/1990 | Strege et al. | 364/562 |
| 5,010,787 | 4/1991 | Stonehocker | 364/424.03 |
| 5,036,479 | 7/1991 | Prednis et al. | 364/571.02 |
| 5,111,402 | 5/1992 | Brooks et al. | 364/424.04 |
| 5,396,422 | 3/1995 | Forchert et al. | 364/424.03 |

FOREIGN PATENT DOCUMENTS

| | | |
|---|---|---|
| 34 37 980 | 4/1986 | Germany . |
| 41 18 692 | 12/1992 | Germany . |
| 2256505 | 12/1992 | United Kingdom . |

*Primary Examiner*—Kevin J. Teska
*Assistant Examiner*—Tan Nguyen
*Attorney, Agent, or Firm*—Evenson, McKeown, Edwards & Lenahan, P.L.L.C.

[57] ABSTRACT

A diagnostic method for motor vehicles with a diagnostic device for checking electronically controlled systems, in which a fault memory provided in an electronic control device is interrogated and in which test steps to be performed in accordance with the information in the fault memory are prescribed. The test steps performed in response to the prescribed test steps are recorded in the electronic control device.

12 Claims, 1 Drawing Sheet

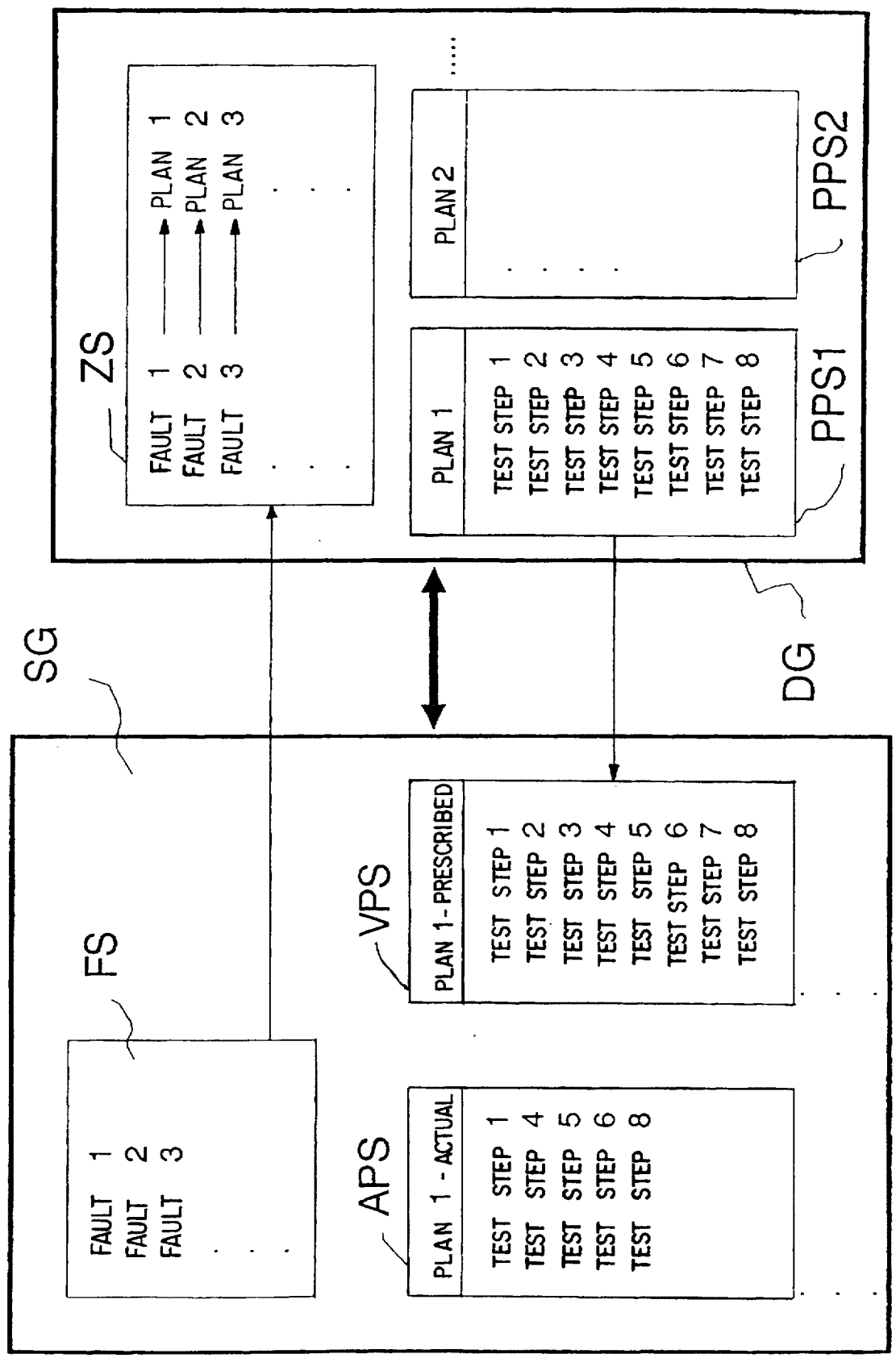

DIAGNOSTIC METHOD FOR MOTOR VEHICLES FOR CHECKING ELECTRONICALLY CONTROLLED SYSTEMS

This application is a continuation of application Ser. No. 08/262,757, filed Jun. 20, 1994, now abandoned.

BACKGROUND AND SUMMARY OF THE INVENTION

The present invention relates to a diagnostic method for motor vehicles with a diagnostic device for checking electronically controlled systems, in which a fault memory provided in an electronic control device is interrogated and in which test steps to be performed are prescribed.

A diagnostic method for motor vehicles with a diagnostic device for checking an electronically controlled system, in which a fault memory provided in an electronic control device is interrogated, is known for example from German Patent Document DE 34 37 980 A1. In this known method, a device is provided with which, for diagnosis, the microcomputer of an electronic control device is replaced by a diagnostic microcomputer pluggable into a plug-in connection, this diagnostic microcomputer comprising, in addition to diagnostic functions, the functions of the microcomputer installed as standard equipment. Recognized faults or malfunctions are stored in a fault memory in the control device and can be transferred, preferably in the maintenance facility, through a connection on the diagnostic microcomputer to an external evaluating device.

External evaluating devices in practice are designed for example so that not only the information to be obtained from the fault memory but also test steps to be performed in accordance with this information are displayed for accurate troubleshooting. As indicated for example in German Patent Document DE 41 18 692 A1, the fault memory for example displays a fault number, the type of fault, and operating parameters that exist when the fault occurs. The type of fault can be for example a short circuit to ground, a short circuit to the positive pole, or a break. The fault number indicates for example which component or electrical path is defective. Such a fault number however is only a functional item of fault information that delimits the location of the fault but cannot pinpoint it.

One possible item of fault information is the lack of a certain sensor signal. This fault can be attributed to several possible causes, however: for example a break at any point in the cable harness or an incompletely inserted plug or a defective input circuit in the control device associated with this sensor signal.

The test steps prescribed on the basis of fault information therefore serve to locate the exact cause of the fault. Since in practice the components associated with a specific fault, especially electronic control devices, are exchanged arbitrarily without performing the test steps, unnecessarily high repair costs result. In addition, components are sent for repair which are actually intact.

An object of the present invention is to monitor function and fault checks during diagnostic procedures, especially in the maintenance facility, and to ensure a correct function and fault check.

This and other objects are achieved by the present invention which provides a diagnostic method for motor vehicles with a diagnostic device for checking electronically controlled systems having an electronic control device with a fault memory and prescribed test steps. This method includes the steps of interrogating the fault memory provided in the electronic control device, and at least partially recording test steps actually performed in response to the prescribed test steps.

The test steps which a garage mechanic for example performs after receiving the test steps to be performed, are at least partially handled by the diagnostic device or control device. In certain embodiments, these test steps, once performed, are stored in the diagnostic device and/or in the control device.

This procedure according to the invention provides a documentation of the test steps performed. This documentation can be used in different ways. The mere fact that a garage mechanic knows that the test steps he performed can be checked motivates him to perform correct functional and fault checking. This results in an elimination of the real and not just suspected faults, so that the availability of the electronically controlled system is increased.

In certain embodiments of the method of the present invention, the test steps recorded are not merely stored in any form, but in the chronological sequence in which they were performed. This additional documentation on the chronological sequence of the test steps performed serves to check whether the fault check was properly performed. For example a component should not be replaced before a search for the fault has been performed. It is also logical not to erase the fault memory until the fault has been eliminated.

In certain embodiments, the test steps included are compared in the control device or in the diagnostic device with at least a selection of the test steps to be performed. One possible selection, for example, is directed at determining whether the most important test steps for determining the cause of a fault have been performed.

In this way, a determination is made automatically by the control device or diagnostic device as to whether a correct fault check has taken place. On the basis of this automatic comparison, automatic reactions on the part of the control device or the diagnostic device are also possible on the basis of the results of the comparison.

Certain embodiments account for the possible result of automatic comparison that indicates a test step to be performed is not included in the test steps presented. Then a message corresponding to this information is displayed and/or stored. Preferably this message is displayed on the diagnostic device and stored in the control device.

As a result of this automatic display or storage of only one item of information, monitoring the function check is simplified.

Another possible result of automatic comparison is the information that the test steps presented differ in their sequence from the sequence of the test steps to be performed. In this case a message likewise corresponding to this information to displayed and/or stored, according to certain embodiments of the invention. Storage takes place in the control device and display takes place on the diagnostic device in preferred embodiments.

A message according to the above described embodiment may include an instruction to repeat the test steps, a warning that the test steps to be performed do not agree with the prescribed test steps, or an indication of which test steps have not been performed, among others.

In certain embodiments of the invention, the test steps that have been performed and included and/or any messages are stored in a nonvolatile form in the control device to be monitored. EEPROMs are preferably used for nonvolatile storage.

This design according to the invention serves in particular to make sure that even a control device that has been unplugged from the power supply and sent for repair can be monitored to determine whether an arbitrary replacement of the control device was performed or whether faults in the other components were ruled out as the cause of the stored fault.

If the anticipated effect occurs as a result of diagnostic method according to the invention, considerable repair costs are saved.

Other objects, advantages and novel features of the present invention will become apparent from the following detailed description of the invention when considered in conjunction with the accompanying drawings.

BRIEF DESCRIPTION OF THE DRAWINGS

The single drawing FIGURE shows an embodiment of the present invention and a possible exchange of information between a control device and a diagnostic device according to a diagnostic method according to the present invention.

DETAILED DESCRIPTION OF THE DRAWINGS

The drawing contains a control device SG and a diagnostic device DG. A bidirectional line is provided between control device SG and diagnostic device DG for example to exchange data. Both the control device SG and the diagnostic device DG are microprocessor-controlled and contain computers not shown here. In addition, the control device SG contains a fault memory FS, in which for example the type of fault, fault location, and fault frequency are stored when faults occur in the system associated with this control device SG corresponding to a known fault recognition program. For example, in the garage, using diagnostic control device DG, this fault memory FS is read out and displayed via a display, not shown here, of diagnostic device DG.

Diagnostic device DG contains an allocation memory ZS in which a separate test plan (Plan 1, Plan 2, Plan 3, . . . ) is assigned to every fault that appears (Fault 1, Fault 2, Fault 3, . . . ). In addition, test plan memories PPS1, PPS2 are provided in the diagnostic device in which the test steps prescribed for each test plan (Test Step 1, Test Step 2, . . . ) are stored corresponding to a predetermined sequence. For example, Plan 1 provides eight test steps which a garage mechanic must perform in sequence. The prescribed test plan is either already known by control device SG or is transmitted to control device SG and stored in a prescribed test plan memory VPS. In addition, a real-time test plan memory (APS) is provided in control device SG in which the actual test steps performed by the garage mechanic are recorded and stored. The prescribed test plan memory VPS and the real-time test plan memory APS are preferably nonvolatile memories. As a result, their contents can be interrogated and compared by diagnostic device DG even when control device SG is unplugged.

However, it is also possible for control device SG itself to compare the two memory contents for example and to store the information in its own memory (not shown here) as to whether the memory contents are identical or not. In this case it is possible to use the diagnostic device DG to call up only this message when exact documentation of the actual test steps performed is not required. If diagnostic device DG determines that the contents of the prescribed test plan memory VPS and the real-time test plan memory APS do not match, a display on the diagnostic device calling for repetition of the prescribed test step is possible.

The following is an example of the use of the diagnostic method according to the invention depending on the contents of the fault memory of a motor control device:

A garage mechanic uses the diagnostic device (DG) to read the fault memory (FS) the fault message "injection valve 1 short circuit to ground" has been stored. The diagnostic device (DG), on the basic of this fault message, prescribes the following test plan for the garage mechanic by allocation memory (ZS):

1. shut off engine
2. operate injection valve 1
3. check leads to injection valve and replace if defective
4. replace injection valve if leads are in order
5. delete fault memory These five test steps must performed in the sequence given. If the garage mechanic in fact only does the following:

1. replaces injection valves
2. deletes the fault memory only test steps 4 and 5 will be stored in the real-time test plan memory (APS), and it can then be determined that test steps 1 to 3 were not performed. If this improper procedure on the part of the garage mechanic is discovered, the garage mechanic can be instructed for example to perform the prescribed test plan again, for example using the diagnostic device (DG). If an improper procedure is discovered, any number of measures are possible in order to motivate the garage mechanic to follow the prescribed test plan when repeating the test steps.

By using nonvolatile memories, an improper procedure in performing the test steps can be discovered even when the control device (SG) is unplugged, so that arbitrary replacement of components without performance of the test steps is prevented.

In addition, the availability of electronically-controlled systems is increased by eliminating only actual and not suspected defects.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. Diagnostic method for motor vehicles, said method using a diagnostic device to check electronically controlled systems and to store prescribed test steps for diagnosing faults, said motor vehicle having an on-board electronic control device with a fault memory and with an actual test step memory, the method comprising the steps of:

using the diagnostic device to interrogate the fault memory provided in the electronic control device to determine a recorded fault; and at least partially recording test steps actually performed in accordance with the prescribed test steps which correspond to the recorded fault, in the actual test step memory.

2. Diagnostic method according to claim 1, wherein the step of recording the test steps actually performed includes recording the test steps actually performed in chronological sequence.

3. Diagnostic method according to claim 1, further comprising comparing the recorded test steps actually performed with the prescribed test steps.

4. Diagnostic method according to claim 3, further comprising displaying a message indicating that at least one of the prescribed test steps is not included in the recorded test steps actually performed.

5. Diagnostic method according to claim 4, further comprising displaying another message indicating that the recorded test steps actually performed differ in sequence from a sequence of the prescribed test steps.

6. Diagnostic method according to claim 3, further comprising storing a message when at least one of the prescribed test steps is not included in the recorded test steps actually performed.

7. Diagnostic method according to claim 6, further comprising displaying another message when the recorded test steps actually performed differ in sequence from a sequence of the prescribed test steps.

8. Diagnostic method according to claim 6, further comprising storing the message in a nonvolatile form in the electronic control device of the electronically controlled system to be checked.

9. Diagnostic method according to claim 1, wherein said at least partially recording test steps comprises storing the test steps actually performed in a nonvolatile form in the electronic control device of the electronically controlled system to be checked.

10. Diagnostic method according to claim 1, wherein said electronic control device further comprises a prescribed test step memory, the method further comprising at least partially storing said prescribed test steps for diagnosing faults in said prescribed test step memory.

11. Diagnostic method for motor vehicles, said method using a diagnostic device to check electronically controlled systems and to store prescribed test steps for diagnosing faults, said motor vehicle having a replaceable on-board electronic control device with a fault memory and with an actual test step memory, the method comprising the steps of:

using the diagnostic device to interrogate the fault memory provided in the electronic control device to determine a recorded fault; and at least partially recording test steps actually performed in accordance with the prescribed test steps which correspond to the recorded fault, in the actual test step memory.

12. Diagnostic method according to claim 11, wherein said electronic control device further comprises a prescribed test step memory, the method further comprising at least partially storing said prescribed test steps for diagnosing faults in said prescribed test step memory.

* * * * *